United States Patent
Kim et al.

(10) Patent No.: US 10,403,651 B2
(45) Date of Patent: Sep. 3, 2019

(54) ARRAY SUBSTRATE, METHOD FOR FABRICATING THE SAME AND DISPLAY DEVICE

(71) Applicant: BOE TECHNOLOGY GROUP CO., LTD., Beijing (CN)

(72) Inventors: Heecheol Kim, Beijing (CN); Youngsuk Song, Beijing (CN); Seongyeol Yoo, Beijing (CN); Seungjin Choi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 62 days.

(21) Appl. No.: 14/429,501

(22) PCT Filed: May 29, 2014

(86) PCT No.: PCT/CN2014/078848
§ 371 (c)(1),
(2) Date: Mar. 19, 2015

(87) PCT Pub. No.: WO2015/096392
PCT Pub. Date: Jul. 2, 2015

(65) Prior Publication Data
US 2016/0027812 A1    Jan. 28, 2016

(30) Foreign Application Priority Data
Dec. 26, 2013   (CN) .......................... 2013 1 0739761

(51) Int. Cl.
*H01L 27/12*   (2006.01)
*H01L 23/31*   (2006.01)
(Continued)

(52) U.S. Cl.
CPC ........ *H01L 27/1248* (2013.01); *H01L 21/441* (2013.01); *H01L 21/56* (2013.01);
(Continued)

(58) Field of Classification Search
None
See application file for complete search history.

(56) References Cited

U.S. PATENT DOCUMENTS

| 8,203,143 B2* | 6/2012 | Imai ................. H01L 29/78696 257/43 |
| 2003/0075733 A1* | 4/2003 | Yamazaki .......... H01L 21/2026 257/200 |

(Continued)

FOREIGN PATENT DOCUMENTS

| CN | 1518089 A | 8/2004 |
| CN | 101154670 A | 4/2008 |

(Continued)

OTHER PUBLICATIONS

Oct. 9, 2014—(CN) International Search Report for PCT/CN2014/078848.

(Continued)

*Primary Examiner* — Samuel A Gebremariam
*Assistant Examiner* — Jonas T Beardsley
(74) *Attorney, Agent, or Firm* — Banner & Witcoff, Ltd.

(57) ABSTRACT

An array substrate, a method for fabricating the same and a display device are disclosed. The array substrate includes: a gate electrode of a TFT and a gate insulation layer sequentially formed on a base substrate; a semiconductor active layer, an etch stop layer and a source electrode and a drain electrode of the TFT sequentially formed on a part of the gate insulation layer that corresponds to the gate electrode of the TFT, the source and drain electrodes of the TFT are respectively in contact with the semiconductor active layer by way of via holes. The array substrate further includes: a first insulation layer formed between the gate electrode of the TFT and the gate insulation layer and the gate electrode is in contact with the gate insulation layer at a channel region (Continued)

of the TFT between the source electrode and the drain electrode of the TFT.

19 Claims, 5 Drawing Sheets

(51) Int. Cl.
| | |
|---|---|
| H01L 23/00 | (2006.01) |
| H01L 29/66 | (2006.01) |
| H01L 23/528 | (2006.01) |
| H01L 21/56 | (2006.01) |
| H01L 21/441 | (2006.01) |
| H01L 29/24 | (2006.01) |
| H01L 23/522 | (2006.01) |
| H01L 29/786 | (2006.01) |
| H01L 29/417 | (2006.01) |
| H01L 29/423 | (2006.01) |
| H01L 21/768 | (2006.01) |

(52) U.S. Cl.
CPC .... *H01L 21/76831* (2013.01); *H01L 23/3171* (2013.01); *H01L 23/528* (2013.01); *H01L 23/5226* (2013.01); *H01L 24/03* (2013.01); *H01L 24/05* (2013.01); *H01L 27/124* (2013.01); *H01L 27/1225* (2013.01); *H01L 27/1259* (2013.01); *H01L 27/1262* (2013.01); *H01L 29/24* (2013.01); *H01L 29/41733* (2013.01); *H01L 29/42384* (2013.01); *H01L 29/66969* (2013.01); *H01L 29/7869* (2013.01); *H01L 29/78603* (2013.01); *H01L 29/78636* (2013.01); *H01L 29/78696* (2013.01); *H01L 2224/08052* (2013.01); *H01L 2924/13069* (2013.01)

(56) References Cited

U.S. PATENT DOCUMENTS

| | | | |
|---|---|---|---|
| 2006/0169973 A1* | 8/2006 | Isa | H01L 51/0022 257/40 |
| 2008/0218670 A1* | 9/2008 | Kumai | G02F 1/134363 349/114 |
| 2009/0321731 A1* | 12/2009 | Jeong | H01L 29/4908 257/43 |
| 2010/0025677 A1 | 2/2010 | Yamazaki et al. | |
| 2010/0289733 A1 | 11/2010 | Kim et al. | |
| 2013/0002326 A1* | 1/2013 | Shionoiri | H01L 27/1225 327/208 |
| 2013/0082242 A1* | 4/2013 | Han | H01L 29/42384 257/29 |
| 2013/0200404 A1* | 8/2013 | Lee | H01L 27/156 257/88 |
| 2013/0285050 A1 | 10/2013 | Yamazaki et al. | |
| 2013/0299820 A1 | 11/2013 | Miyamoto et al. | |
| 2014/0340607 A1* | 11/2014 | Nakata | H01L 29/7869 349/46 |

FOREIGN PATENT DOCUMENTS

| | | |
|---|---|---|
| CN | 101359670 A | 2/2009 |
| CN | 101764091 A | 6/2010 |
| CN | 103296033 A | 9/2013 |
| CN | 103325792 A | 9/2013 |
| CN | 103730475 A | 4/2014 |
| CN | 203644780 U | 6/2014 |
| JP | 2002050313 A | 2/2002 |

OTHER PUBLICATIONS

Oct. 9, 2014—(CN) Written Opinion for PCT/CN2014/078848—Eng Tran.
Oct. 13, 2015—(CN)—First Office Action Appn 201310739761.4 with English Tran.
Jan. 12, 2017—(EP) Extended European Search Report Appn 14856805.8.

\* cited by examiner

ARRAY SUBSTRATE, METHOD FOR FABRICATING THE SAME AND DISPLAY DEVICE

The application is a U.S. National Phase Entry of International Application No. PCT/CN2014/078848 filed on May 29, 2014, designating the United States of America and claiming priority to Chinese Patent Application No. 201310739761.4 filed on Dec. 26, 2013. The present application claims priority to and the benefit of the above-identified applications and the above-identified applications are incorporated by reference herein in their entirety.

FIELD OF THE ART

Embodiments of the invention relate to the technical field of displays, more particularly, to an array substrate, a method for fabricating the same and a display device.

BACKGROUND

With the ever development of Thin Film Transistor Liquid Crystal Display (TFT-LCD) technologies, various novel semiconductor devices and application thereof to display devices also experienced rapid advance.

During the fabrication procedures of conventional TFT-LCDs, more and more manufacturers try to replace amorphous silicon (a-Si) TFTs or Low Temperature Polycrystalline Silicon (LTPS) TFTs with Oxide TFTs, such that display products of higher quality may be developed. Oxide TFT back plate technology is a back plate technology with a similar fabrication procedure to conventional a-Si TFTs. In the oxide TFT back plate technology, the original silicon semiconductor material applied to the a-Si TFT is replaced by an oxide semiconductor material, such as the currently most popular Indium Gallium Zinc Oxide (IGZO), to form a semiconductor active layer of the TFT. FIG. 1 schematically illustrates a typical conventional array substrate with oxide TFTs, which comprises a gate electrode of a TFT, a gate insulation layer 12 and a semiconductor active layer 13 sequentially formed on a transparent substrate 10, the semiconductor active layer 13 is formed from IGZO. An etch stop layer 14 with via holes A and B are formed on the semiconductor active layer 13 through a patterning process, the via holes A and B respectively penetrate through the etch stop layer 14 to expose the semiconductor active layer 13. A source electrode 151 and a drain electrode 152 of the TFT are connected to the semiconductor active layer 13 respectively through the via holes A and B.

SUMMARY

Embodiments of the invention provide an array substrate, a method for fabricating the same and a display device.

A first aspect of the invention provides an array substrate. The array substrate comprises: a gate electrode of a TFT and a gate insulation layer sequentially formed on a base substrate; a semiconductor active layer, an etch stop layer and a source electrode and a drain electrode of the TFT sequentially formed on a part of the gate insulation layer that corresponds to the gate electrode of the TFT, the source and drain electrodes of the TFT are respectively in contact with the semiconductor active layer by way of via holes. The array substrate further comprises: a first insulation layer formed between the gate electrode of the TFT and the gate insulation layer, wherein the first insulation layer corresponds to at least one of the source electrode or the drain electrode of the TFT; and the gate electrode is in contact with the gate insulation layer at a channel region of the TFT between the source electrode and the drain electrode of the TFT.

Another aspect of the invention provides a display device comprising the above TFT array substrate.

Still another aspect of the invention provides a method for fabricating an array substrate. The method comprises:
forming a gate electrode of a TFT on a base substrate;
forming a first insulation layer on the base substrate having the gate electrode formed thereon, wherein the first insulation layer corresponds to at least one of a source electrode and a drain electrode of the TFT; and
forming a gate insulation layer on the base substrate having the first insulation layer formed thereon, wherein the gate electrode is in contact with the gate insulation layer at a channel region of the TFT.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
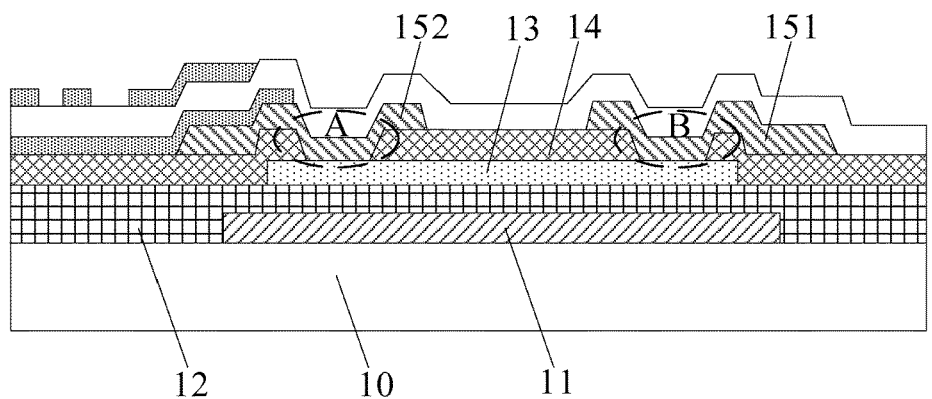
FIG. 1 schematically illustrates a configuration of a conventional array substrate.

In a conventional Oxide TFT array substrate as illustrated in FIG. 1, a source electrode 151 and a drain electrode 152 of the TFT have a relatively large overlapping region with a gate electrode 11 respectively. When the TFT is turned on, a parasitic capacitance Cgs is formed between the source electrode 151 and the gate electrode 11; similarly a parasitic capacitance Cgd is formed between the drain electrode 152 and the gate electrode 11. At an instant when the gate line 11 controls ON/OFF of the TFT through a voltage, due to the existence of the parasitic capacitances Cgs and Cgd, a voltage signal of the gate line 11 changes from a high value to a low value when the TFT is turned off, which causes the drain electrode 152 to output a jump voltage, thereby generating an abrupt voltage drop in liquid crystals in a pixel. As a result, the precision of the pixel electrode voltage will be compromised, causing displayed picture to flicker.

Figure 2:
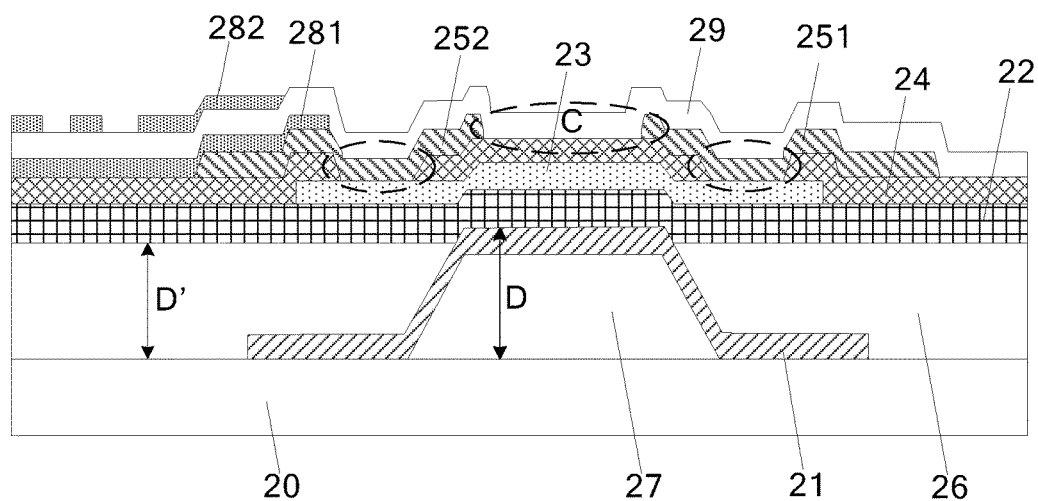
FIG. 2 schematically illustrates a configuration of an array substrate in accordance with an embodiment of the invention.

As illustrated in FIG. 2, an array substrate in accordance with an embodiment of the invention comprises:

a gate electrode 21 of a TFT and a gate insulation layer 22 sequentially formed on a base substrate 20;

a semiconductor active layer 23, an etch stop layer 24 and a source electrode 251 and a drain electrode 252 of the TFT sequentially formed on a part of the gate insulation layer 22 that corresponds to the gate electrode 21 of the TFT, the source electrode 251 and the drain electrode 252 of the TFT are respectively in contact with the semiconductor active layer 23 by way of via holes (indicated by dotted boxes of FIG. 2).

In the disclosure, "A corresponds to B" means A and B face each other along a vertical direction or at least partly overlap with each other along a vertical direction. Therefore, "a part of the gate insulation layer 22 that corresponds to the gate electrode 21 of the TFT" refers to the part of the gate insulation layer 22 that faces or partially overlaps the gate electrode 21 of the TFT along the vertical direction.

The array substrate further comprises:

A first insulation layer 26 formed between the gate electrode 21 of the TFT and the gate insulation layer 22, wherein the first insulation layer 26 corresponds to at least one of the source electrode 251 and the drain electrode 252 of the TFT.

Moreover, the gate electrode 21 is in contact with the gate insulation layer 22 at a channel region of the TFT between the source electrode 251 and the drain electrode 252 of the TFT. No insulation layer 26 is required, because a small distance between the gate electrode material and the semiconductor active layer has to be guaranteed at a region corresponding to the TFT channel.

In comparison with the conventional array substrate with Oxide TFTs as illustrated in FIG. 1, it is clearly seen that a distance between the source electrode 251 or the drain electrode 252 of the TFT and the gate electrode 21 on the array substrate as illustrated in FIG. 2 is much greater than a distance between the source electrode 151 or the drain electrode 152 of the TFT and the gate electrode 21 on the array substrate as illustrated in FIG. 1.

In the array substrate provided by the above embodiment of the invention, between the gate electrode of the TFT and the gate insulation layer, a first insulation with a certain thickness is formed in a region of the corresponding source and/or electrode drain of the TFT. Such a configuration helps to increase the distance between the gate electrode of the TFT and the source/drain electrode of the TFT significantly, thereby reducing a capacitance of a parallel-plate capacitor (formed by the gate electrode and the source/drain electrode of the TFT) obviously as the distance between two electrodes of the parallel-plate capacitor is increased. As a result, the parasitic capacitance Cgs formed between the source electrode and the gate electrode of the TFT or the parasitic capacitance Cgd formed between the drain electrode and the gate electrode of the TFT is decreased effectively, which in turn prevents jump voltage defect caused by large parasitic capacitances Cgd, Cgs, effectively eliminating the flicker of displayed images and improving the quality of the display device.

As an embodiment, the first insulation layer 26 corresponds to at least one of the source electrode 251 and the drain electrode 252 of the TFT. In the array substrate as illustrated in FIG. 2, an example of the first insulation layer 26 corresponding to both the source electrode 251 and the drain electrode 252 of the TFT is described. When an array substrate as illustrated in FIG. 2 is employed, the distance between the source electrode 251 or the drain electrode 252 and the gate electrode 21 of the TFT is significantly increased, thereby the parasitic capacitance Cgs between the source electrode 251 and the gate electrode 21 of the TFT or the parasitic capacitance Cgd between the drain electrode 252 and the gate electrode 21 of the TFT is decreased effectively. As an embodiment, the first insulation layer 26 corresponds to the source electrode 251 of the TFT only. In this case, as the distance between the source electrode 251 and the gate electrode 21 of the TFT which functions as two electrodes of a parallel-plate capacitor is increased, the parasitic capacitance Cgs between the source electrode 251 and the gate electrode 21 of the TFT is decreased effectively. Similarly, as another embodiment, the first insulation layer 26 corresponds to the drain electrode 252 of the TFT only, thereby effectively decreasing the parasitic capacitance Cgd between the drain electrode 252 and the gate electrode 21 of the TFT.

As an embodiment, when the first insulation layer 26 corresponding to both the source electrode 251 and the drain electrode 252 of the TFT, two parts of the first insulation layer 26 that respectively correspond to the source electrode 251 of the TFT and the drain electrode 252 of the TFT are of the same thickness (that is, the left and right parts of the first insulation layer 26 of FIG. 2 are of the same thickness).

As illustrated in FIG. 2, in an embodiment, a thickness D' of the first insulation layer 26 is 1 μm to 3 μm. A first insulation layer 26 with such a thickness may be easily fabricated with conventional patterning processes, while reducing the capacitance between the electrodes, thereby effectively reducing the fabrication difficulty.

To reduce the capacitance between parallel plates, it is seen from the parallel plate capacitance equation $C=\varepsilon S/d$ that the capacitance may be reduced by increasing the distance between the two electrodes, when other conditions remain the same. As the distance between the two electrodes (one electrode being the source electrode 251 or the drain electrode 252, the other being the gate electrode 21) of FIG. 2 is increased, the capacitance is decreased, thereby effectively decreasing the impact of jump voltage generated by the parasitic capacitance on the display images.

As illustrated in FIG. 2, the array substrate of the embodiment further comprises:

a second insulation layer 27 formed between the base substrate 20 and the gate electrode 21 of the TFT; the second insulation layer 27 corresponds to the channel of the TFT (region C of FIG. 2); and a sum of a thickness of the second insulation layer 27 and that of the gate electrode 21 of the TFT is larger than or equal to the thickness D' of the first insulation layer 26. In an embodiment, the first insulation layer 26 and the second insulation layer 27 are made of a material having good insulativity, such as organic resin, which will not be defined by the invention.

By this means, the gate electrode of the TFT in the channel region of the corresponding TFT is elevated by fabricating the second insulation layer 27 on the region, such that no obvious level difference exists between an upper surface of the gate electrode and that of the first insulation layer 26. Furthermore, by controlling the thickness of the first and second insulation layers, the sum of the thickness of the second insulation layer 27 and that of the gate electrode 21 of the TFT is larger than or equal to the thickness D' of the first insulation layer 26, thereby ensuring that at least the surface of the gate electrode 21 are exposed, to guarantee the channel of the TFT is formed.

It is noted that the TFT-LCD array substrate provided by the above embodiments may be applied to LCDs such as Fringe Field Switching (FFS) LCDs, Advanced-Super Dimensional Switching (AD-SDS or ADS) LCDs, In-Plane Switch (IPS) LCDs or Twist Nematic (TN) LCDs.

Whatever the LCD is, it always comprises cell-assembled color filter substrate and array substrate. However, in a TN display device, common electrodes are disposed on the color filter substrate while pixel electrodes are disposed on the array substrate. In contrast, in FFS, ADS and IPS display devices, both the common electrodes and the pixel electrodes are disposed on the array substrate.

In the following, an example of the array substrate being applied to a FFS display device will be described. As illustrated in FIG. 2, the array substrate according to the above embodiments further comprises:

a first transparent electrode 281 formed on the etch stop layer 24 and in contact with the drain electrode 252 of the TFT;

a passivation layer 29 formed on the first transparent electrode 281 and overlaying the TFT; and a second transparent electrode 282 formed on the passivation layer 29.

Herein "overlaying the TFT" means that overlaying at least regions having the gate electrode, drain electrode and source electrode of the TFT.

In an embodiment, the first transparent electrode 281 is a pixel electrode and the second transparent electrode 282 is a common electrode; moreover, the first transparent electrode 281 is a plate electrode, and the second transparent electrode 282 is a strip electrode comprising a plurality of metal strips arranged as spaced apart from each other.

Optionally, an electrode disposed in an upper layer is a strip electrode, while an electrode disposed in a lower layer is a strip or plate electrode. The above embodiment is described with reference to an example of the electrode in the lower layer being a plate electrode. In the array substrate of the FFS display device, the common electrode and the pixel electrode are disposed in different layers. Herein "being disposed in different layers" means that forming at least two patterns from at least two films through a patterning process, and the at least two patterns are in different layers. As an example, "the common electrode and the pixel electrode being disposed in different layers" means that the lower electrode is formed from a first transparent conductive film through a patterning process and the upper electrode is formed from a second transparent conductive film through a patterning process, the lower electrode being a common electrode (or a pixel electrode), and the upper electrode being a pixel electrode (or a common electrode).

An array substrate with a configuration as provided by the embodiment of the invention is also applicable to an IPS display device. The IPS display device differs from the FFS display device in that the common electrode and the pixel electrode are disposed in the same layer, the common electrode comprises a plurality of first strip electrodes, and the pixel electrode comprises a plurality of second strip electrodes. Herein "being disposed in the same layer" means that forming at least two patterns from the same film through a patterning process. For example, "the common electrode and the pixel electrode being disposed in the same layer" means that the pixel electrode and the common electrode are formed from the same transparent conductive film through a patterning process. The pixel electrode is an electrode electrically connected to the data line via a switch element (such as a TFT), and the common electrode is an electrode electrically connected to the common electrode line.

In at least one embodiment of the invention, the semiconductor active layer 23 is made of a transparent metal oxide material with a semi-conductive property. For example, the transparent metal oxide material comprises at least one of IGZO, IGO, ITZO, AlZnO. By using such a transparent metal oxide material to form the semiconductor active layer of the TFT in place of a-Si or LTPS, there is the advantage of low requirement on fabrication temperature and high mobility. The technology may be applied to high frequency and high resolution display products and has the advantage of low equipment and operation cost in comparison with the LTPS TFT technology.

Another embodiment of the invention further provides a display device comprising the above array substrate.

In an embodiment, the array substrate comprises a first insulation layer formed between the gate electrode of the TFT and the gate insulation layer, wherein the location of the first insulation layer corresponds to at least one of the source electrode or the drain electrode of the TFT; and the gate electrode is in contact with the gate insulation layer at a channel region of the TFT.

The display device provided by the embodiment of the invention may be a liquid crystal panel, an E-paper, an OLED panel, a liquid crystal television, a LCD, a digital photoframe, a mobile phone, a tablet PC and any other products or components having a display function.

In the display device comprising the array substrate provided by the above embodiment, the first insulation layer with a certain thickness is formed at a location corresponding to source electrode region and/or drain electrode region of the TFT between the gate electrode of the TFT and the gate insulation layer. As a result, the distance between the gate electrode and the source/drain electrode of the TFT is significantly increased. With the distance between two electrodes of a parallel plate capacitor, the capacitance is significantly decreased, thereby effectively reducing the parasitic capacitance Cgs between the source electrode and the gate electrode of the TFT or the parasitic capacitance Cgd between the drain electrode and the gate electrode of the TFT, which in turn prevents jump voltage defect caused by large parasitic capacitance, effectively eliminating the flicker of displayed images and improving the quality of the display device.

Still another embodiment of the invention further provides a method for fabricating an array substrate, comprising:

S301: forming a gate electrode of a TFT on a base substrate.

S302: forming a first insulation layer on the base substrate having the gate electrode formed thereon, wherein the first insulation layer corresponds to at least one of a source electrode or a drain electrode of the TFT.

In an embodiment, the first insulation layer corresponds to at least one of the source electrode or the drain electrode of the TFT. In the array substrate as illustrated in FIG. 2, an example of the first insulation layer 26 corresponding to both the source electrode 251 and the drain electrode 252 of the TFT is described. When the array substrate as illustrated in FIG. 2 is employed, the distance between the source electrode 251 or the drain electrode 252 and the gate electrode 21 of the TFT is significantly increased, thereby effectively reducing the parasitic capacitance Cgs between the source electrode 251 and the gate electrode 21 of the TFT and the parasitic capacitance Cgd between the drain electrode 252 and the gate electrode 21 of the TFT. As an embodiment, the first insulation layer 26 corresponds to the source electrode 251 of the TFT only. In this case, as the distance between the source electrode 251 and the gate electrode 21 of the TFT which function as two electrodes of the parallel-plate capacitor is increased, the parasitic capacitance Cgs between the source electrode 251 and the gate electrode 21 of the TFT is decreased effectively. Similarly, as another embodiment, the first insulation layer 26 corresponds to the drain electrode 252 of the TFT only, thereby effectively decreasing the parasitic capacitance Cgd between the drain electrode 252 and the gate electrode 21 of the TFT.

As an embodiment, when the first insulation layer 26 corresponds to both the source electrode 251 and the drain electrode 252 of the TFT, two parts of the first insulation layer 26 that respectively correspond to the source electrode 251 of the TFT and the drain electrode 252 of the TFT are of the same thickness (that is, the left and right parts of the first insulation layer 26 of FIG. 2 are of the same thickness). As illustrated in FIG. 2, in an embodiment, a thickness D' of the first insulation layer 26 is 1 μm to 3 μm. A first insulation layer 26 with such a thickness may be easily fabricated with conventional patterning process, while reducing the capacitance between the electrodes, thereby effectively reducing the fabrication difficulty.

To reduce the capacitance between a parallel plates, it is seen from the parallel plate capacitance equation C=εS/d that the capacitance may be reduced by increasing the distance between the two electrodes, when other conditions remain the same. By this means, the capacitance between the two electrodes of the embodiment is decreased in comparison with thereby effectively decreasing the impact of jump voltage generated by the parasitic capacitance on the display images.

S303: forming a gate insulation layer on the base substrate having the first insulation layer formed thereon, wherein the gate electrode is in contact with the gate insulation layer at a channel region of the TFT.

No insulation layer is required, because a small distance between the gate electrode material and the semiconductor active layer has to be guaranteed at a region corresponding to the TFT channel.

In the method for fabricating the array substrate provided by the above embodiment, the first insulation layer with a certain thickness is formed at a location corresponding to source electrode region and/or drain electrode region of the TFT between the gate electrode of the TFT and the gate insulation layer. As a result, the distance between the gate electrode and the source/drain electrode of the TFT is significantly increased. With the distance between two electrodes of a parallel plate capacitor, the capacitance is significantly decreased, thereby effectively reducing the parasitic capacitance Cgs between the source electrode and the gate electrode of the TFT or the parasitic capacitance Cgd between the drain electrode and the gate electrode of the TFT, which in turn prevents jump voltage defect caused by large parasitic capacitance, effectively eliminating the flicker of displayed images and improving the quality of the display device.

Furthermore, a method for fabricating an array substrate provided by still another embodiment of the invention comprises:

S401: forming a second insulation layer on a base substrate through a patterning process, wherein the second insulation layer corresponds to a TFT channel.

Figure 3:
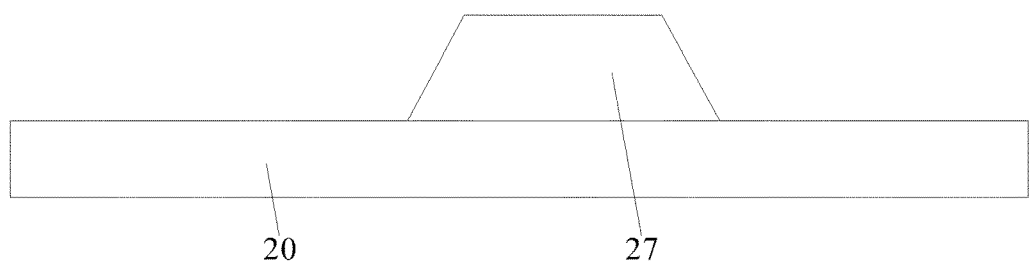
FIG. 3 schematically illustrates a configuration of a substrate having a second insulation layer formed thereon in accordance with an embodiment of the invention.

During the actual fabrication procedure of the array substrate, the base substrate is formed from a transparent material having a certain hardness such as glass or transparent resin, then the second insulation layer is formed on the base substrate through a patterning process. For example, an organic resin material of a certain thickness is first applied to a surface of the base substrate to form the second insulation film. Then the second insulation layer 27 as illustrated in FIG. 3 is formed by exposure and developing using a mask with specific pattern.

S402: forming a gate electrode of the TFT on the substrate having the second insulation layer formed thereon through a patterning process.

Figure 4:
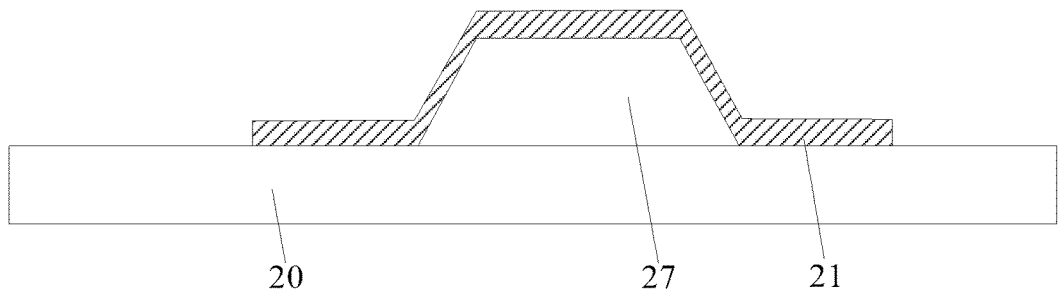
FIG. 4 schematically illustrates a configuration of a substrate having a gate electrode of a TFT formed thereon in accordance with an embodiment of the invention FIG. 5 schematically illustrates a configuration of a substrate having a first insulation layer formed thereon in accordance with an embodiment of the invention.

For example, a metal layer is formed on the substrate having the second insulation layer formed thereon by using PECVD, magnetron sputtering, thermal evaporation and other film formation method. The metal layer may be a single layer film formed from a metal or an alloy such as molybdenum, aluminum, aluminum rubidium alloy, tungsten, chrome, copper and the like, or a multi-layer film of the above metals or alloy. Then photoresist is applied to a surface of the metal layer; a part of the metal layer is exposed through exposure and development by using a mask with a certain pattern; the exposed metal layer is peeled off to form the gate electrode 21 of the TFT on the surface of the second insulation as illustrated in FIG. 4.

S403: forming a first insulation layer on the gate electrode of the TFT.

Figure 5:
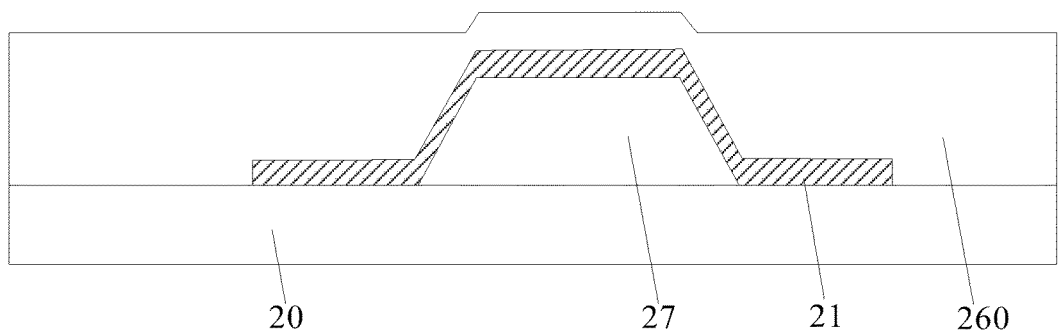

As an example, an organic resin layer is applied to a surface of the substrate having the gate electrode of the TFT formed thereon, as illustrated in FIG. 5, to form a first insulation layer 260. The first insulation layer 260 completely overlays the gate electrode of the TFT.

S404: ashing the first insulation layer to expose at least the gate electrode of the TFT that corresponds to the TFT channel.

Figure 6:
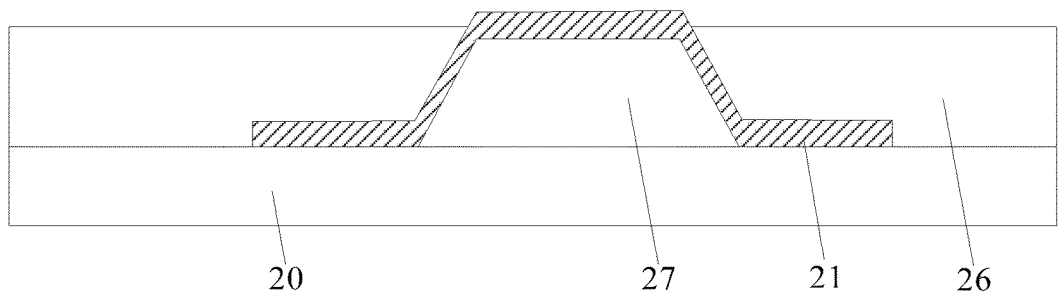
FIG. 6 schematically illustrates a configuration of a substrate having a first insulation layer formed thereon in accordance with an embodiment of the invention.

As illustrated in FIG. 6, the overall thickness of the first insulation layer 260 will decrease after the ashing process, until the surface of the gate electrode of the TFT is exposed to eventually form the patterned first insulation layer 26. The embodiment of the invention is described with reference to the ashing process. It can be understood that other known patterning process may be used to expose the surface of the gate electrode of the TFT, which will not be defined here.

In an embodiment, a sum of a thickness of the second insulation layer 27 and that of the gate electrode 21 of the TFT is larger than or equal to the thickness D' of the first insulation layer 26. In an embodiment, the first insulation layer 26 and the second insulation layer 27 are made of a material having good insulativity, such as organic resin, which will not be defined by the invention.

By this means, the gate electrode 21 of the TFT on the channel region of the corresponding TFT is elevated by fabricating the second insulation layer 27 on the region, such that no obvious level difference exists between an upper surface of the gate electrode 21 that corresponds to the TFT channel and that of the first insulation layer 26. Furthermore, by controlling the thickness of the first and second insulation layers, the sum of the thickness of the second insulation layer 27 and that of the gate electrode 21 of the TFT is larger than or equal to the thickness D' of the first insulation layer 26, thereby ensuring that at least the surface of the gate electrode 21 are exposed, to guarantee the channel of the TFT is formed.

S405: forming a gate insulation layer on the substrate having the first insulation layer formed thereon, the gate electrode is in contact with the gate insulation layer at the channel region of the TFT.

Figure 7:
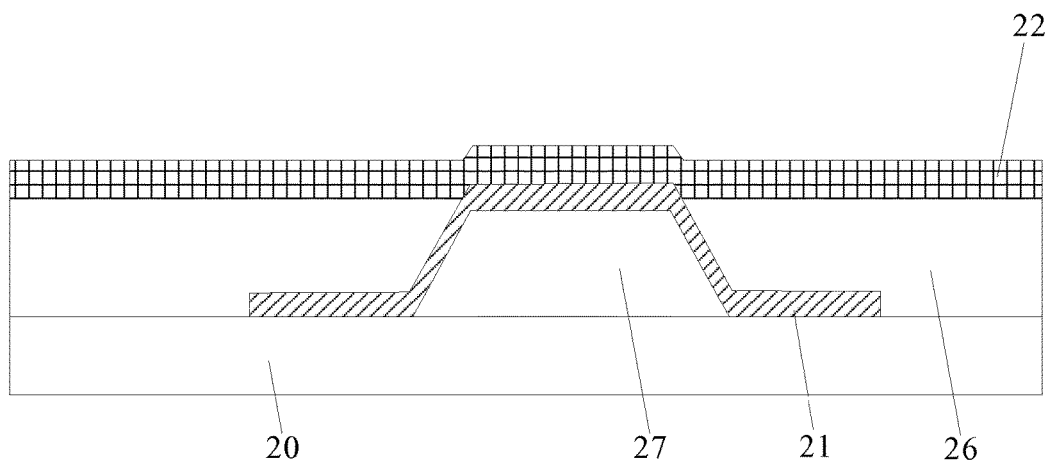
FIG. 7 schematically illustrates a configuration of a substrate having a gate insulation layer formed thereon in accordance with an embodiment of the invention.

As illustrated in FIG. 7, a gate insulation layer 22 with a uniform thickness is formed on the substrate having the first insulation layer formed thereon.

S406: forming a semiconductor active layer on the gate electrode of the TFT that corresponds to the gate insulation layer through a patterning process.

Figure 8:
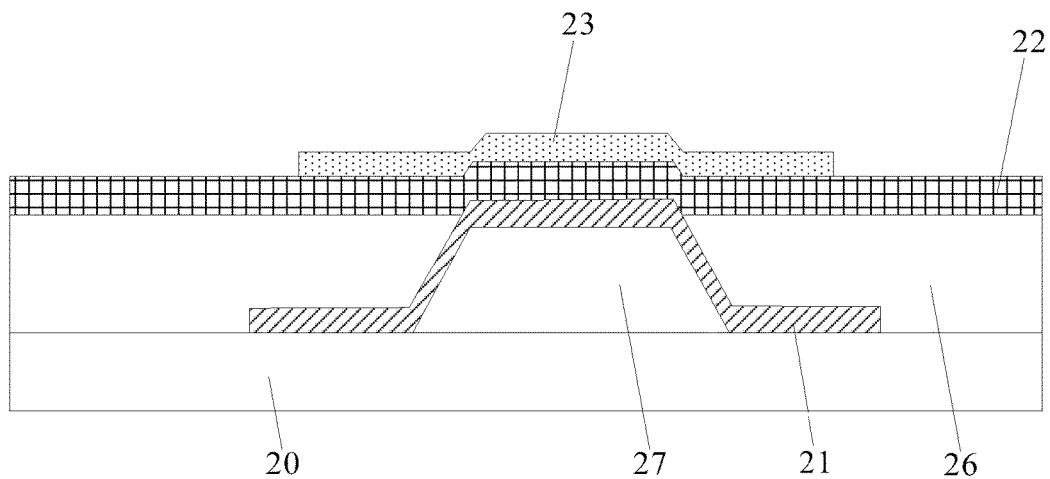
FIG. 8 schematically illustrates a configuration of a substrate having a semiconductor active layer formed thereon in accordance with an embodiment of the invention.

As an example, a semiconductor active layer film with a semi-conductive property is formed on the substrate having the above structure, and a semiconductor active layer 23 as illustrated in FIG. 8 is formed though exposure and development by using a mask.

In at least one embodiment of the invention, the semiconductor active layer 23 is made of a transparent metal oxide material with a semi-conductive property. For example, the transparent metal oxide material comprises at least one of IGZO, IGO, ITZO, AlZnO. By using such a transparent metal oxide material to form the semiconductor active layer of the TFT in place of a-Si or LTPS, there is the advantage of low requirement on fabrication temperature and high mobility. The technology may be applied to high frequency and high resolution display products and has the advantage of low equation and low cost in comparison with the LTPS TFT technology.

S407: forming an etch stop layer with via holes on the semiconductor active layer through a patterning process.

Figure 9:
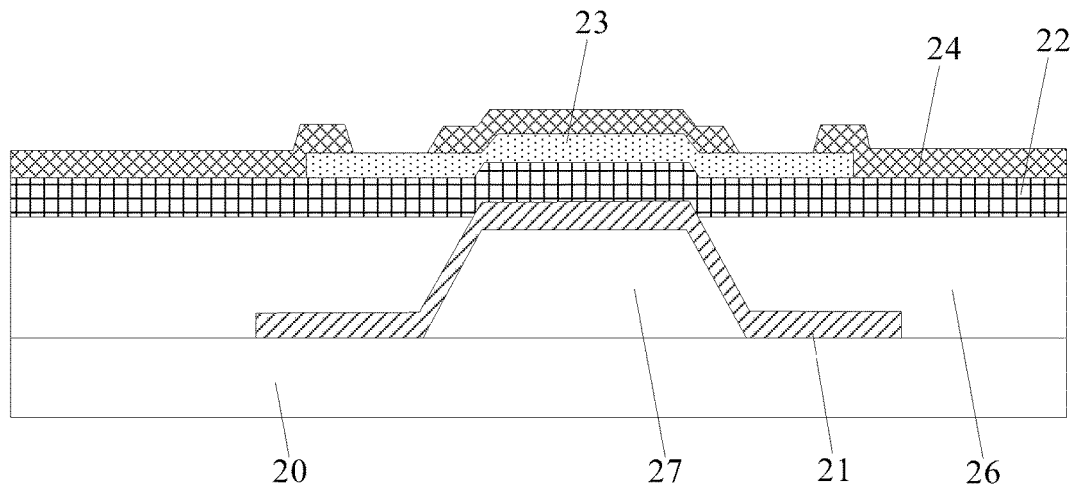
FIG. 9 schematically illustrates a configuration of a substrate having an etch stop layer formed thereon in accordance with an embodiment of the invention.

An etch stop layer 24 is illustrated in FIG. 9. For example, an etch stop layer film is applied or deposited on the substrate having the above structure formed thereon, then exposure and development are performed by using a mask having a certain pattern to form via holes respectively at locations corresponding to the source electrode and the drain electrode of the TFT (as indicated by dotted lines in FIG. 9), at the bottom of the via holes the semiconductor active layer 23 is exposed, thereby obtaining the etch stop player 24.

S408: forming the source electrode and the drain electrode of the TFT on the etch stop layer through a patterning process, the source and drain electrodes of the TFT are respectively in contact with the semiconductor active layer by way of the via holes.

Figure 10:
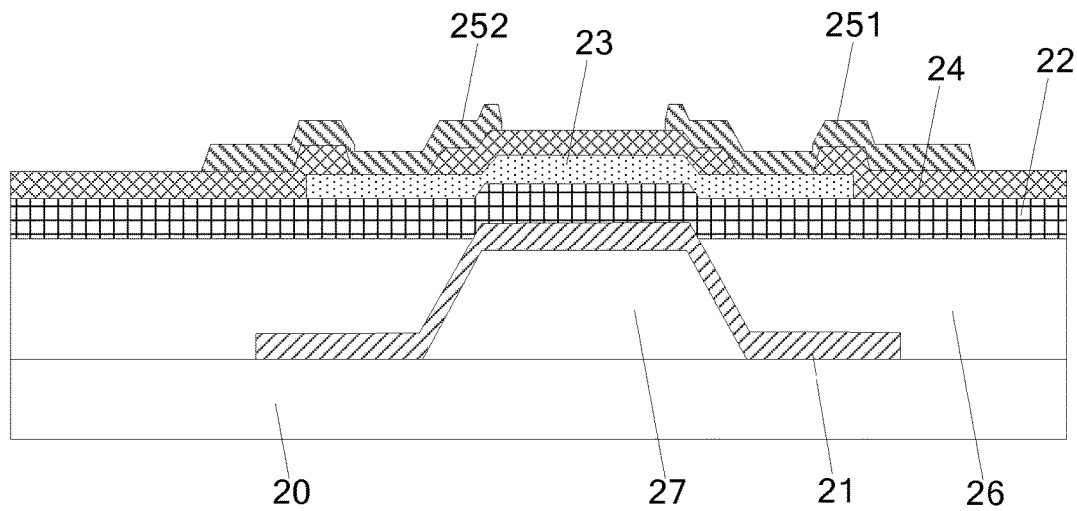
FIG. 10 schematically illustrates a configuration of a substrate having a source electrode and a drain electrode of the TFT formed thereon in accordance with an embodiment of the invention.

A configuration of the substrate having the source electrode 251 and the drain electrode 252 of the TFT is illustrated in FIG. 10.

S409: forming a first transparent electrode on the substrate having the source and drain electrodes of the TFT formed thereon through a patterning process, the first transparent electrode is in contact with the drain electrode of the TFT.

Figure 11:
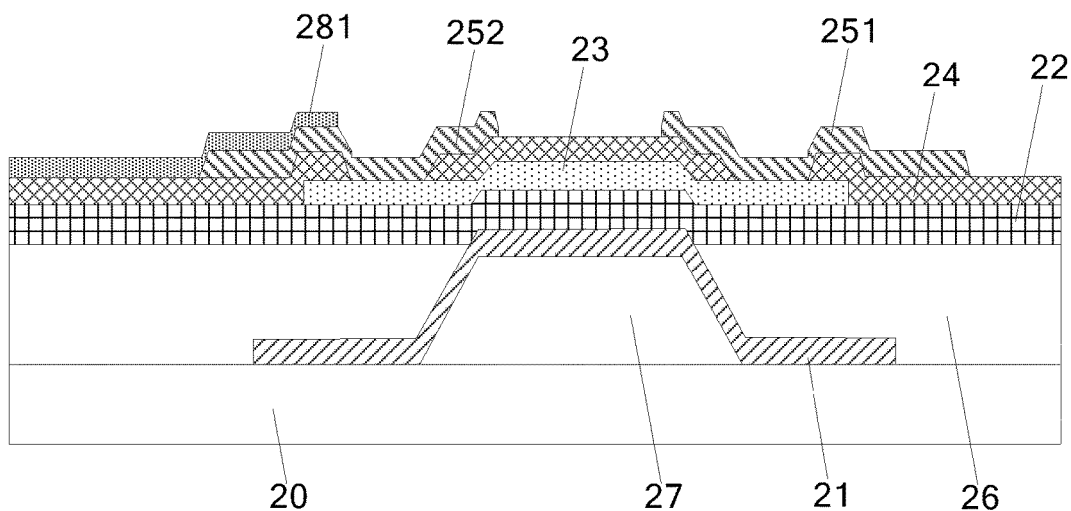
FIG. 11 schematically illustrates a configuration of a substrate having a first transparent electrode formed thereon in accordance with an embodiment of the invention.

A configuration of the substrate having the first transparent electrode 281 is illustrated in FIG. 11.

S410: forming a passivation layer on the first transparent electrode through a patterning process, the passivation layer overlays the TFT.

Figure 12:
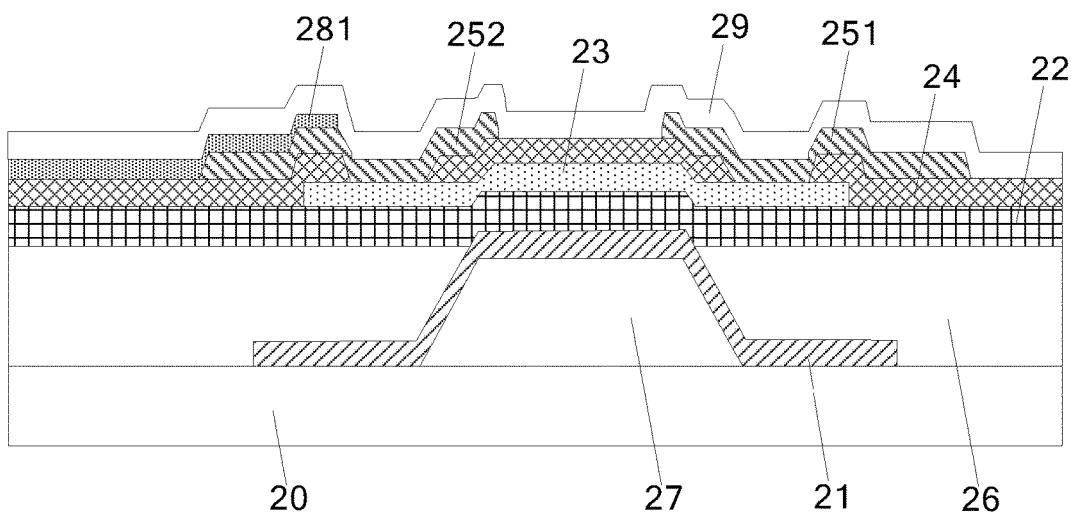
FIG. 12 schematically illustrates a configuration of a substrate having a passivation layer formed thereon in accordance with an embodiment of the invention.

A configuration of the substrate having the passivation layer 29 formed thereon is illustrated in FIG. 12.

S411: forming a second transparent electrode on the passivation layer through a patterning process. Finally the array substrate as illustrated in FIG. 2 is formed.

It is noted that the embodiment of the invention is described with reference to an example of a FFS display device. The first transparent 281 is a pixel electrode and the second transparent electrode 282 is a common electrode; moreover, the first transparent electrode 281 is a plate electrode, and the second transparent electrode 282 is a strip electrode comprising a plurality of metal strips arranged as spaced apart from each other.

The array substrate with the configuration as provided by the embodiment of the invention is also applicable to array substrates of various display devices such as ADS, IPS or TN display devices. For specific arrangements and shapes of the common electrode and the pixel electrode please refer to the description of the above embodiments. It can be contemplated that when the arrangements and shapes of the common electrode or the pixel electrode are varied due to different types of the display devices, various array substrates can still be fabricated by modifying the steps or processes for forming the pixel electrode or the common electrode, which will not be elaborated herein.

By using the above method for fabricating the array substrate, the distance between the gate electrode and the source/drain electrode of the TFT is significantly increase. With the distance between two electrodes of a parallel plate capacitor, the capacitance is significantly decreased, thereby effectively reducing the parasitic capacitance Cgs between the source electrode and the gate electrode of the TFT or the parasitic capacitance Cgd between the drain electrode and the gate electrode of the TFT, which in turn prevents jump voltage defect caused by large parasitic capacitance, effectively eliminating the flicker of displayed images and improving the quality of the display device.

This application claims the priority of Chinese Application No. 201310739761.4, filed on Dec. 26, 2013, and which application is incorporated herein by reference.

What is described above is related to the illustrative embodiments of the disclosure only and not limitative to the scope of the disclosure; the scopes of the disclosure are defined by the accompanying claims.

What is claimed is:

1. An array substrate, comprising:
   a gate electrode of a TFT and a gate insulation layer formed on a base substrate;
   a semiconductor active layer on the gate insulation layer,
   an etch stop layer on the semiconductor active layer,
   a source electrode and a drain electrode of the TFT formed on the gate insulation layer,
   wherein the source electrode and the drain electrode of the TFT are in contact with the semiconductor active layer by way of via holes;
   a first insulation layer formed between the gate electrode of the TFT and the gate insulation layer, wherein the first insulation layer covers side surfaces of the gate electrode,
   wherein an upper surface of the gate electrode is directly in contact with the gate insulation layer at a channel region of the TFT between the source electrode and the drain electrode of the TFT, and at least one end of the gate electrode is directly in contact with the base substrate; and a second insulation layer formed between the base substrate and the gate electrode of the TFT, wherein the second insulation layer at least partially overlaps with the channel region of the TFT, wherein an upper surface of the second insulation layer is entirely covered by the gate electrode, and wherein a first side surface and a second side surface of the second insulating layer are entirely covered by the gate electrode.

2. The array substrate of claim 1, wherein a sum of a thickness of the second insulation layer and that of the gate electrode of the TFT is larger than or equal to a thickness of the first insulation layer.

3. The array substrate of claim 2, wherein the first and second insulation layers are made of an organic resin material.

4. The array substrate of claim 1, further comprising:
a first transparent electrode formed on the etch stop layer and in contact with the drain electrode of the TFT;
a passivation layer formed on the first transparent electrode and overlaying the TFT; and
a second transparent electrode formed on the passivation layer.

5. The array substrate of claim 4, wherein the first transparent electrode is a pixel electrode and the second transparent electrode is a common electrode, and wherein the first transparent electrode is a plate electrode, and the second transparent electrode is a strip electrode.

6. The array substrate of claim 1, wherein the first insulation layer corresponds to both the source electrode and the drain electrode of the TFT.

7. The array substrate of claim 6, wherein two portions of the first insulation layer that respectively correspond to the source electrode and the drain electrode of the TFT are of a same thickness ranging from 1 µm to 3 µm.

8. The array substrate of claim 1, wherein the semiconductor active layer is made of a transparent metal oxide material with a semi-conductive property.

9. The array substrate of claim 1, wherein a surface of the gate electrode corresponding to the channel region of the TFT is flush with a surface of the first insulation layer.

10. A display device, comprising the array substrate of claim 1.

11. The array substrate of claim 1, wherein the gate electrode comprises a portion between the gate insulation layer and the second insulation layer, a portion between the first insulation layer and the second insulation layer, and a portion between the base substrate and the first insulation layer, and the first insulation layer covers the gate electrode in a region overlapped with the at least one of the source electrode and the drain electrode of the TFT, in a direction perpendicular to the base substrate.

12. A method for fabricating an array substrate, comprising:
forming a second insulation layer on a base substrate;
forming a gate electrode of a TFT on the second insulation layer, wherein an upper surface of the second insulation layer is entirely covered by the gate electrode, wherein a first side surface and a second side surface of the second insulating layer are entirely covered by the gate electrode, and wherein at least one end of the gate electrode is directly in contact with the base substrate;

forming a first insulation layer on the base substrate having the gate electrode formed thereon, wherein the first insulation layer is formed in at least one of a source region or a drain region of the TFT, and the first insulation layer covers the gate electrode in at least one of the source region or the drain region; and forming a gate insulation layer on the base substrate having the first insulation layer formed thereon, wherein the gate electrode is directly in contact with the gate insulation layer at a channel region of the TFT;

forming a semiconductor active layer on the gate insulation layer and in the channel region, wherein the second insulation layer at least partially overlaps with the semiconductor active layer;

forming an etch stop layer with via holes on the semiconductor active layer; and forming a source electrode in the source region on the etch stop layer and a drain electrode in the drain region on the etch stop layer, wherein the source electrode and the drain electrode of the TFT are in contact with the semiconductor active layer by way of the via holes.

13. The method of claim 12, wherein the step of forming the first insulation layer on the base substrate having the gate electrode formed thereon comprises:
depositing the first insulation layer on the gate electrode of the TFT; and
ashing the first insulation layer to expose the gate electrode of the TFT that corresponds to the channel region of the TFT.

14. The method of claim 12, further comprising:
forming a first transparent electrode on the base substrate having the source electrode and the drain electrode of the TFT formed thereon, wherein the first transparent electrode is in contact with the drain electrode of the TFT;
forming a passivation layer on the first transparent electrode, the passivation layer overlaying the TFT; and
forming a second transparent electrode on the passivation layer through a patterning process.

15. The method of claim 14, wherein the first transparent electrode is a pixel electrode and the second transparent electrode is a common electrode, and wherein the first transparent electrode is a plate electrode, and the second transparent electrode is a strip electrode.

16. The method of claim 12, wherein the first and second insulation layers are made of an organic resin material.

17. The method of claim 12, wherein the first insulation layer corresponds to both the source electrode and the drain electrode of the TFT.

18. The method of claim 17, wherein two portions of the first insulation layer that respectively correspond to the source electrode and the drain electrode of the TFT are of a same thickness ranging from 1 µm to 3 µm.

19. The method of claim 12 wherein the semiconductor active layer is made of a transparent metal oxide material with a semi-conductive property.

* * * * *